(12) United States Patent
Lee et al.

(10) Patent No.: US 10,504,748 B2
(45) Date of Patent: Dec. 10, 2019

(54) METHOD OF PACKAGING A POWER AMPLIFIER MODULE HAVING A UNIFIED PATTERN AND CERAMIC SIDEWALL

(71) Applicant: CENTER FOR INTEGRATED SMART SENSORS FOUNDATION, Daejeon (KR)

(72) Inventors: Kyung Hak Lee, Gyeonggi-do (KR); Min Seok Han, Gyeonggi-do (KR); Young Ki Kim, Daejeon (KR)

(73) Assignee: CENTER FOR INTEGRATED SMART SENSORS FOUNDATION, Daejeon (KR)

( * ) Notice: Subject to any disclaimer, the term of this patent is extended or adjusted under 35 U.S.C. 154(b) by 0 days.

(21) Appl. No.: 14/854,098

(22) Filed: Sep. 15, 2015

(65) Prior Publication Data
US 2017/0040182 A1    Feb. 9, 2017

(30) Foreign Application Priority Data

Aug. 7, 2015  (KR) ........................ 10-2015-0111710

(51) Int. Cl.
| | |
|---|---|
| H01L 21/48 | (2006.01) |
| H01L 23/047 | (2006.01) |
| H01L 23/15 | (2006.01) |
| H01L 23/057 | (2006.01) |
| H01L 23/08 | (2006.01) |
| H03F 3/21 | (2006.01) |
| H05K 1/03 | (2006.01) |
| H05K 1/11 | (2006.01) |

(Continued)

(52) U.S. Cl.
CPC ........ *H01L 21/481* (2013.01); *H01L 21/4807* (2013.01); *H01L 23/047* (2013.01); *H01L 23/057* (2013.01); *H01L 23/08* (2013.01); *H03F 3/21* (2013.01); *H05K 1/0306* (2013.01); *H05K 1/115* (2013.01); *H05K 3/103* (2013.01); *H01L 23/15* (2013.01); *H01L 23/49827* (2013.01)

(58) Field of Classification Search
CPC . H01L 21/4807; H01L 21/481; H01L 23/047; H01L 23/057; H01L 23/08; H01L 23/15; H01L 23/49827
See application file for complete search history.

(56) References Cited

U.S. PATENT DOCUMENTS

| | | | |
|---|---|---|---|
| 5,314,507 A * | 5/1994 | Rossoll | H01M 2/0212 29/623.2 |
| 6,509,633 B1 * | 1/2003 | Takagi | H01L 23/057 257/678 |

(Continued)

FOREIGN PATENT DOCUMENTS

| | | |
|---|---|---|
| CN | 104103599 A | 10/2014 |
| EP | 0035438 A2 | 9/1981 |

(Continued)

*Primary Examiner* — Duy T Nguyen
(74) *Attorney, Agent, or Firm* — Blank Rome LLP (57) ABSTRACT

Disclosed is a method of packaging a power amplifier module. The method of packaging a power amplifier module includes providing a unified pattern including a ceramic layer and a pattern formed on the ceramic layer, bonding the unified pattern on a metal layer, and depositing a ceramic sidewall, on which at least one external signal connection lead line is formed, on the unified pattern bonded the metal layer.

4 Claims, 8 Drawing Sheets

(51) Int. Cl.
*H05K 3/10* (2006.01)
*H01L 23/498* (2006.01)

(56) References Cited

U.S. PATENT DOCUMENTS

| | | |
|---|---|---|
| 7,911,271 B1 | 3/2011 | Jia |
| 2005/0035447 A1* | 2/2005 | Basho .................. H01L 23/057 |
| | | 257/712 |
| 2006/0033200 A1* | 2/2006 | Nagano ............... H01L 21/4807 |
| | | 257/700 |
| 2006/0139903 A1 | 6/2006 | Takagi |
| 2007/0175660 A1* | 8/2007 | Yeung .................. H01L 23/492 |
| | | 174/521 |
| 2010/0091477 A1 | 4/2010 | Takagi et al. |

FOREIGN PATENT DOCUMENTS

| | | |
|---|---|---|
| EP | 0177943 A2 | 4/1986 |
| EP | 0408228 A2 | 1/1991 |
| JP | H0794673 | 4/1995 |
| JP | 2010050422 A | 3/2010 |
| JP | 2010283349 A | 12/2010 |
| JP | 2013149760 A | 8/2013 |

\* cited by examiner

METHOD OF PACKAGING A POWER AMPLIFIER MODULE HAVING A UNIFIED PATTERN AND CERAMIC SIDEWALL

CROSS-REFERENCE TO RELATED APPLICATIONS

A claim for priority under 35 U.S.C. § 119 is made to Korean Patent Application No. 10-2015-0111710 filed Aug. 7, 2015, in the Korean Intellectual Property Office, the entire contents of which are hereby incorporated by reference.

BACKGROUND

The inventive concepts described herein relate to a power amplifier module package and a method of packaging the same, and more particularly, relate to packaging a power amplifier module using a unified pattern.

According to a conventional technique, a power amplifier module is packaged using a package base formed of a metal material. Here, the package base is formed of a metal material to have a metal sidewall including a ceramic layer and a groove into which a pattern is inserted.

As described above, in the conventional power amplifier module packaging technique, all sidewalls of the package base are formed of a metal material, thereby causing an increase in the cost of production.

Furthermore, the conventional power amplifier module packaging technique may necessitate the following additional processes after providing the power amplifier module package: thinly or thickly forming and etching a ceramic layer for insulation on the package base when inserting a pattern.

Embodiments of the inventive concept may provide a technique in which a unified pattern including a ceramic layer and a pattern formed on the ceramic layer is used, and thus, may lower manufacturing costs and may not need an additional process for thinly or thickly forming and etching a ceramic layer.

SUMMARY

One aspect of embodiments of the inventive concept is directed to provide a method of packaging a power amplifier module using a unified pattern including a ceramic layer and a pattern formed on the ceramic layer and a power amplifier module package manufactured according to the method.

Another aspect of embodiments of the inventive concept is directed to provide a method of packaging a power amplifier module using a ceramic sidewall, and a power amplifier module package manufactured according to the method, thereby lowering manufacturing costs.

Still another aspect of embodiments of the inventive concept is directed to provide a method of packaging a power amplifier module, which uses a unified pattern including a ceramic layer and a pattern formed on the ceramic layer, and a power amplifier module package manufactured according to the method, thereby making it unnecessary to perform an additional process for thinly or thickly forming and etching a ceramic layer.

In accordance with one aspect of the inventive concept, a method of packaging a power amplifier module includes providing a unified pattern including a ceramic layer and a pattern formed on the ceramic layer, bonding the unified pattern on a metal layer, and depositing a ceramic sidewall, on which at least one external signal connection lead line is formed, on the unified pattern bonded the metal layer.

The ceramic sidewall may include at least one vertical via plug formed to connect the at least one external signal connection lead line to the pattern.

The bonding of the unified pattern may include coating a metal coating layer on a surface of the metal layer, and bonding the unified pattern on the surface on which the metal coating layer is coated.

The method may further include integrating a chip in a groove, which is formed on the ceramic layer included in the unified pattern, so as to be connected with the pattern.

The depositing of the ceramic sidewall may include forming a metal line on the ceramic sidewall.

The forming of the metal line may include disposing an insulating layer between the ceramic sidewall and the metal line.

The method may further include mounting a cover on the ceramic sidewall deposited on the unified pattern bonded on the metal layer.

In accordance with another aspect of the inventive concept, a method of packaging a power amplifier module includes depositing a ceramic sidewall on a metal layer and forming at least one external signal connection lead line on the ceramic sidewall.

The forming of the at least one external signal connection lead line may include forming a metal line on a top surface of the ceramic sidewall.

The forming of the metal line may include disposing an insulating layer between the ceramic sidewall and the metal line.

In accordance with still another aspect of the inventive concept, a power amplifier module package includes a unified pattern including a ceramic layer and a pattern formed on the ceramic layer, a metal layer on which the unified pattern is bonded, and a ceramic sidewall deposited on the unified pattern bonded on the metal layer. At least one external signal connection lead line may be formed on the ceramic sidewall.

The ceramic sidewall may include at least one vertical via plug formed to connect the at least one external signal connection lead line to the pattern.

After a metal coating layer is coated on a surface of the metal layer, the unified pattern may be bonded on the surface on which the metal coating layer is coated.

In accordance with yet another aspect of the inventive concept, a power amplifier module package includes a metal layer, a ceramic sidewall deposited on the metal layer, and at least one external signal connection lead line formed on the ceramic sidewall.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1A:
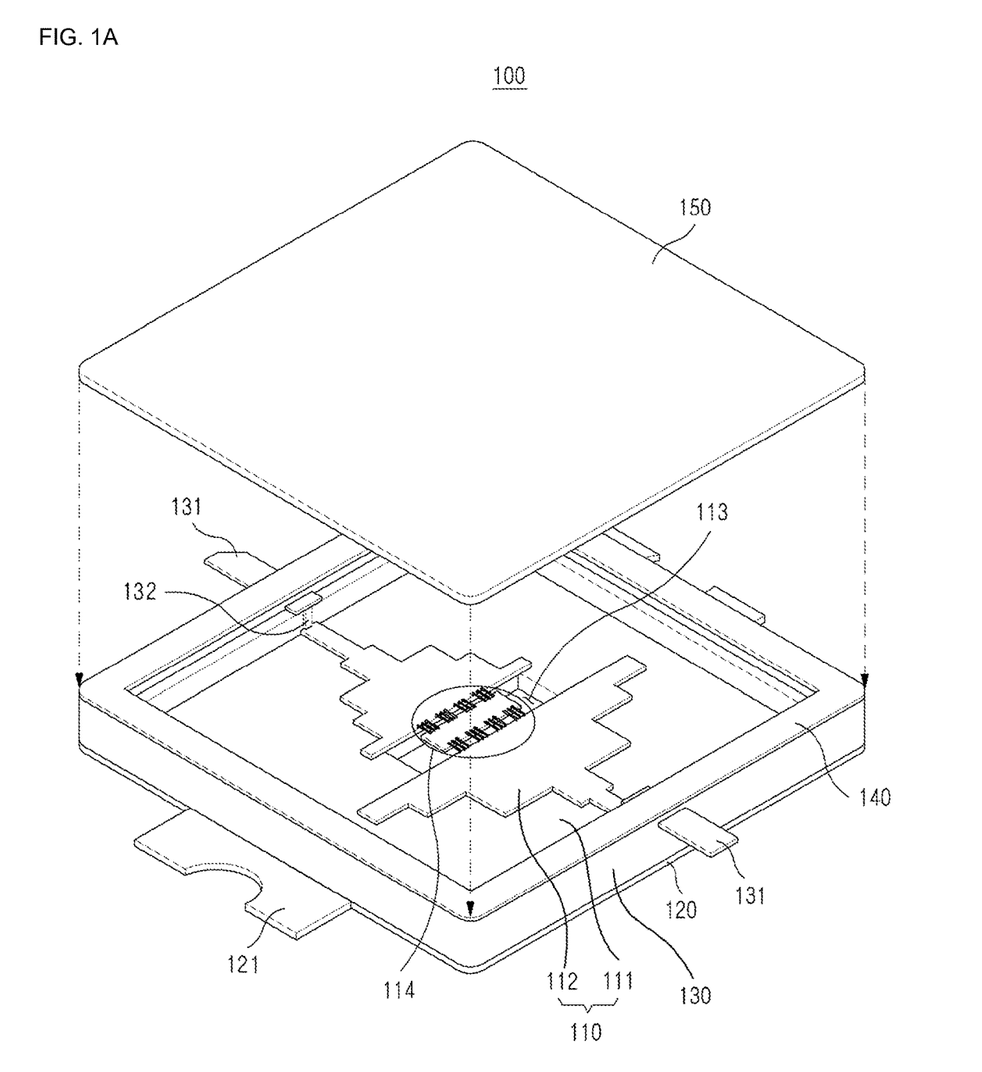
FIGS. 1A and 1B are diagrams illustrating a power amplifier module package according to an embodiment of the inventive concept.
Figure 1B:
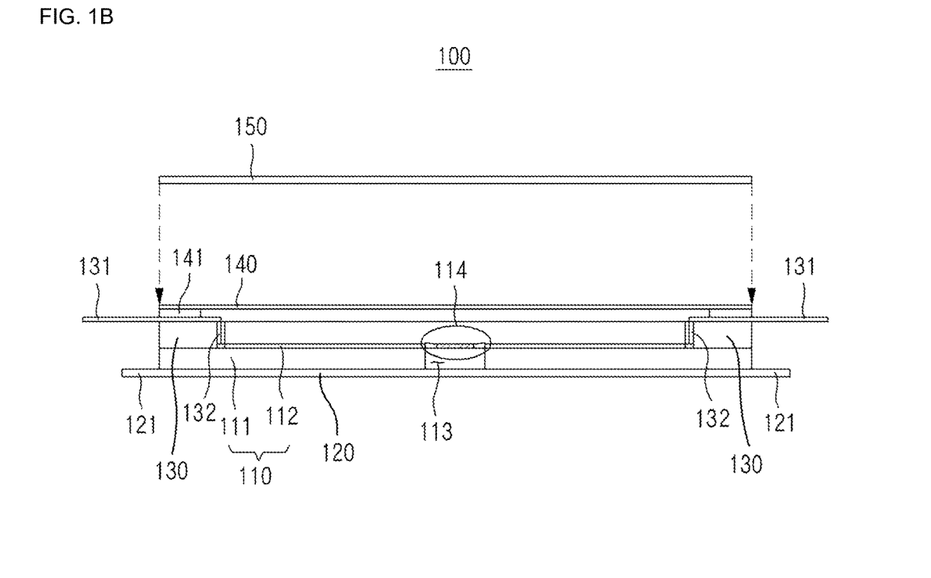

FIGS. 1A and 1B are diagrams illustrating a power amplifier module package according to an embodiment of the inventive concept. In detail, FIG. 1A is a perspective view illustrating a power amplifier module package according to an embodiment of the inventive concept, and FIG. 1B is a cross-sectional view illustrating a power amplifier module package according to an embodiment of the inventive concept.

Referring to FIGS. 1A and 1B, a power amplifier module package 100 may include a unified pattern 110 including a ceramic layer 111 and a pattern 112 formed on the ceramic layer 111, a metal layer 120 on which the unified pattern 110 is bonded, and a ceramic sidewall 130 deposited on the unified pattern 110 bonded on the metal layer 120. Here, at least one external signal connection lead line 131 may be formed on a top surface of the ceramic sidewall 130. Below, unlike a power amplifier module package according to another embodiment of the inventive concept to be described with respect to FIGS. 5A and 5B, the power amplifier module package 100 according to an embodiment of the inventive concept may be a unified package which is packaged to include the unified pattern 110.

The pattern 112 may be in advance formed on the ceramic layer 111 based on a use of the power amplifier module package 100. Here, the ceramic layer 111 may be formed of various insulating materials. For example, the pattern 112 may be formed according to a position (e.g., on the remaining area except an area where a groove 113 is located) of the groove 113 formed on the ceramic layer 111 such that a chip 114 is connected thereto and is integrated thereon. In FIGS. 1A and 1B, the chip 114 may be illustrated as being integrated and included in the pattern 112. However, the scope and spirit of the inventive concept may not be limited thereto. For example, the chip 114 may not be included in the pattern 112 so as to be integrated on an external system equipped with the power amplifier module package 100.

After a metal coating layer such as, but not limited thereto (e.g., various metal materials or metal mixture materials are used), Ni is coated on a surface of the metal layer 120, the unified pattern 110 may be bonded on the surface on which the metal coating layer is coated. This will be more fully described with reference to FIG. 3.

Here, the metal layer 120 may include at least one connection frame 121 connecting the power amplifier module package 100 to other modules. Here, the metal layer 120 may be formed of a mixture material of Cu and graphite. However, the scope and spirit of the inventive concept may not be limited thereto. For example, the metal layer 120 may be formed of various metal materials or metal mixture materials which have thermal conductivity in a predetermined range and thermal expansion in a predetermined range. This will be more fully described with reference to FIG. 2.

Below, it is assumed that the ceramic sidewall 130 deposited on the unified pattern 110 bonded to the metal layer 120 is formed of a ceramic material. However, the scope and spirit of the inventive concept may not be limited thereto. For example, the ceramic sidewall 130 may be formed of various materials including a conductive material, an insulating material, or the like. The at least one external signal connection lead line 131 may be formed on a top surface of the ceramic sidewall 130. For example, the at least one external signal connection lead line 131 may be bonded on the top surface of the ceramic sidewall 130. Here, the at least one external signal connection lead line 131 may be formed of various conductive materials.

Moreover, the ceramic sidewall 130 may include at least one vertical via plug 132 which is formed so as to connect the at least one external signal connection lead line 131 to the pattern 112. For example, the at least one vertical via plug 132 may be formed by filling a hole, formed in the ceramic sidewall 130, with a metal material such that the pattern 112 is connected to the at least one external signal connection lead line 131. Accordingly, the pattern 112 may be electrically connected to an external device through the at least one vertical via plug 132 and the at least one external signal connection lead line 131.

Moreover, a metal line 140 may be formed on the ceramic sidewall 130. Accordingly, a cover 150 may be mounted on the ceramic sidewall 130, which is deposited on the unified pattern 110 bonded on the metal layer 120, with the metal line 140 interposed between the cover 150 and the ceramic sidewall 130. Here, the cover 150 may be formed of various metal materials or metal mixture materials such as a material for forming the metal layer 120 or may be formed of a dielectric material. Moreover, the metal line 140 may be formed of various metal materials or metal mixture materials to allow the cover 150 to be connected in a laser welding manner (e.g., lid mounting).

Here, the metal line 140 may be formed on a top surface of an insulating layer 141 for insulation between the metal line 140 and the at least one external signal connection lead line 131 formed on a top surface of the ceramic sidewall 130. The insulating layer 141 may be formed of various insulation materials for forming the ceramic layer 111.

Figure 2:
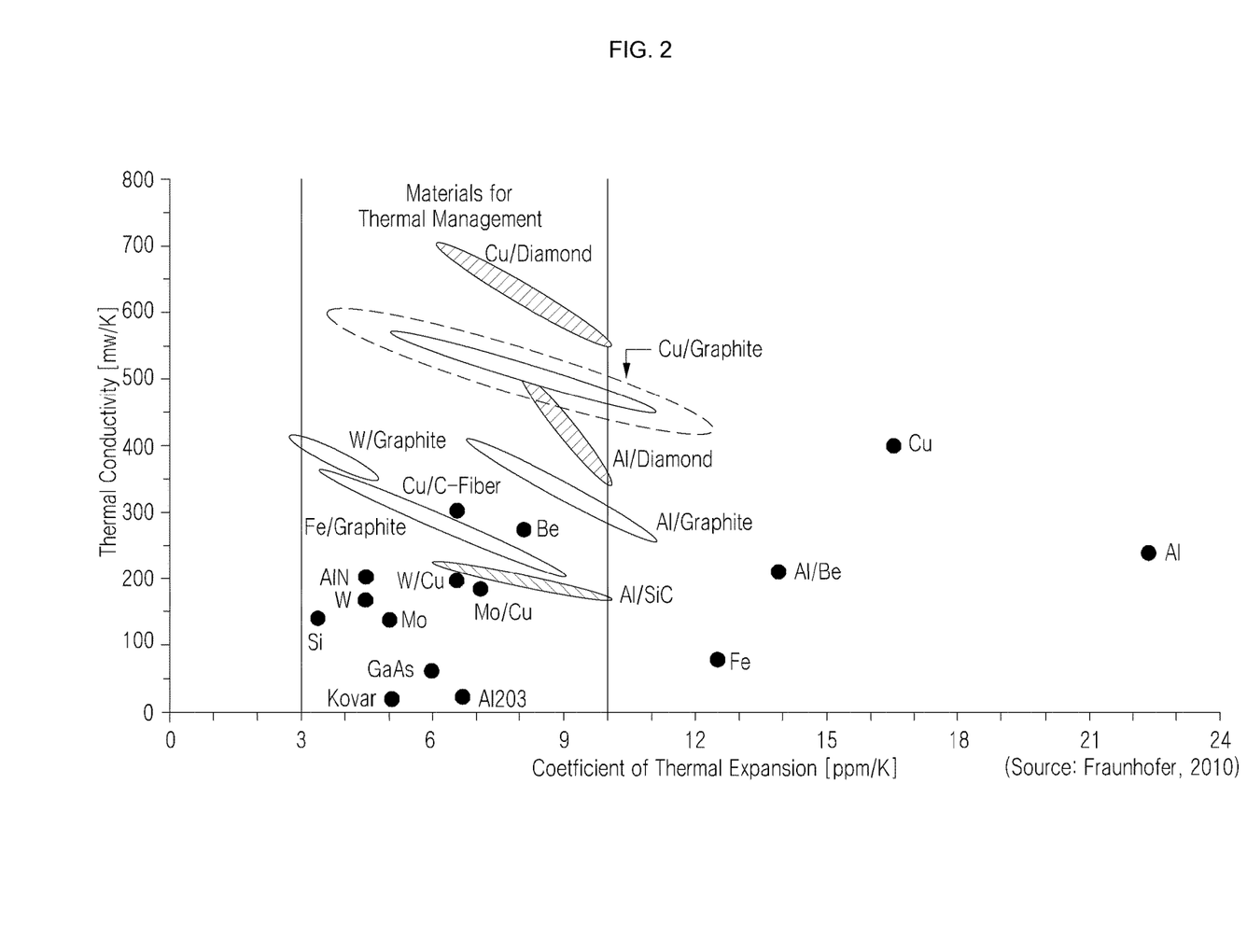
FIG. 2 is a graph for describing a metal layer according to an embodiment of the inventive concept.

FIG. 2 is a graph for describing a metal layer according to an embodiment of the inventive concept.

Referring to FIG. 2, a metal layer on which a unified pattern according to an embodiment of the inventive concept is bonded may be formed of various metal materials or metal mixture materials which have thermal conductivity in a predetermined range and thermal expansion in a predetermined range.

For example, as illustrated in FIG. 2, the metal layer may be formed of a metal mixture material or a metal material such as a mixture material of Cu and graphite, a mixture material of Cu and diamond, a mixture material of Al and diamond, a mixture material of Al and graphite, a mixture material of Cu and C-Fiber, a mixture material of W and graphite, a mixture material of Fe and graphite, a mixture material of PP and Cu, a metal material of Be, or the like, which has thermal conductivity higher than a mixture material of W and Cu.

Moreover, a metal coating layer coated on the metal layer, at least one external signal connection lead line, a pattern included in a unified pattern, at least one vertical via plug, a cover, and a metal line may be also formed of a metal mixture material or a metal material such as a mixture material of Cu and graphite, a mixture material of Cu and diamond, a mixture material of Al and diamond, a mixture material of Al and graphite, a mixture material of Cu and C-Fiber, a mixture material of W and graphite, a mixture material of Fe and graphite, a mixture material of PP and Cu, a metal material of Be, or the like.

Figure 3:
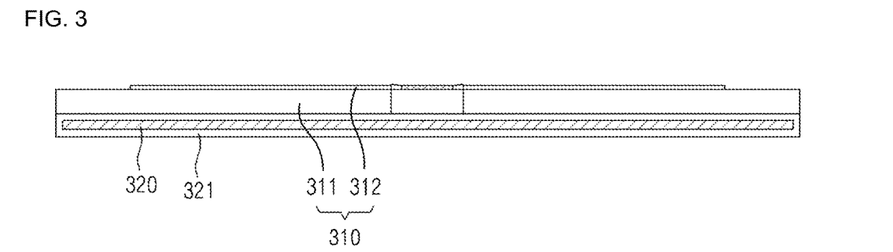
FIG. 3 is a cross-sectional view for describing the procedure for bonding a metal layer on a unified pattern, according to an embodiment of the inventive concept.

FIG. 3 is a cross-sectional view for describing the procedure for bonding a metal layer on a unified pattern, according to an embodiment of the inventive concept.

Referring to FIG. 3, after a metal coating layer 321 is coated on a surface of a metal layer 320, a unified pattern 310 according to an embodiment of the inventive concept which includes a ceramic layer 311 and a pattern 312 formed on the ceramic layer 311 may be bonded on the surface on which the metal coating layer 321 is coated.

Figure 4:
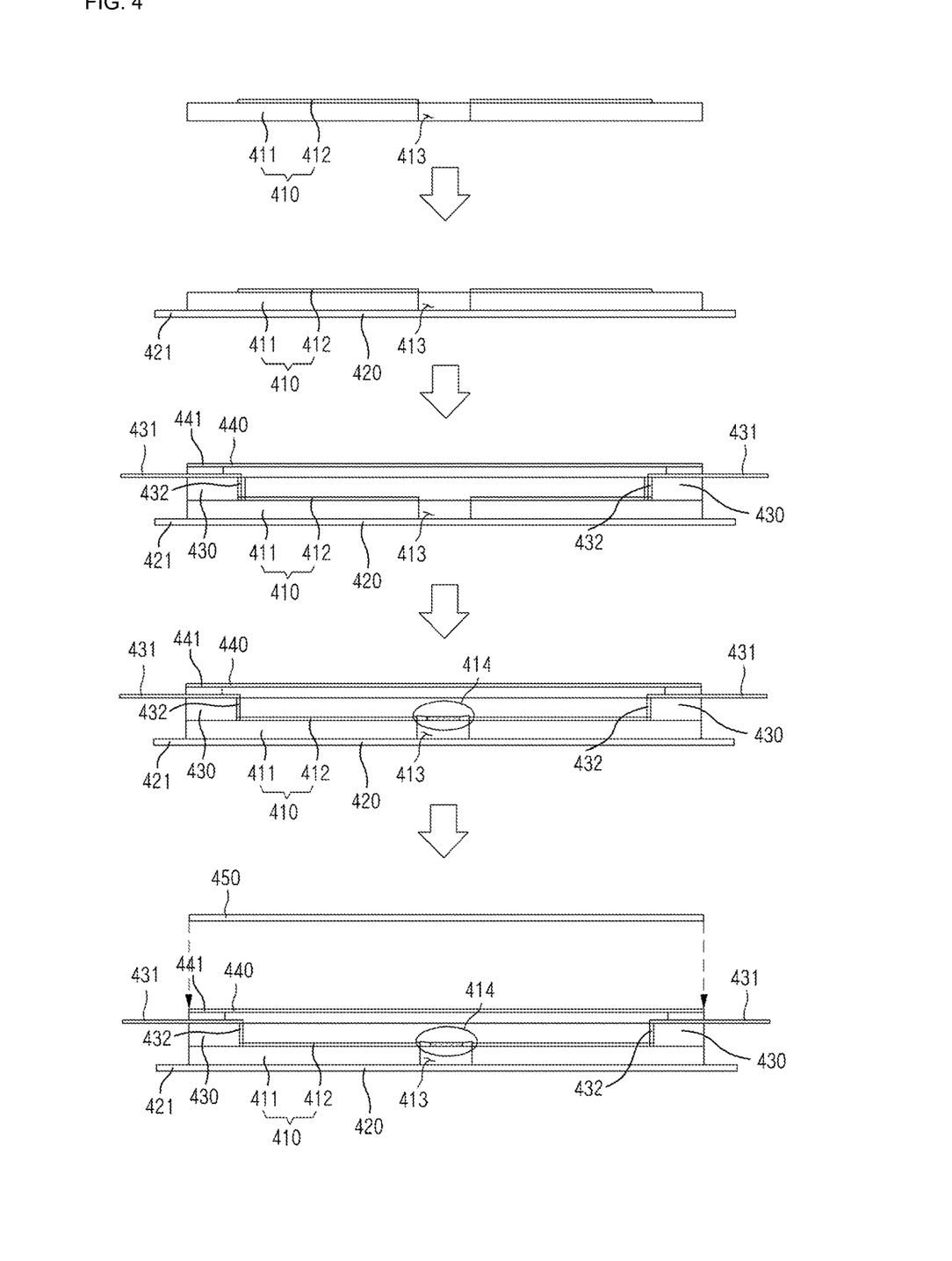
FIG. 4 is cross-sectional views illustrating a method of packaging a power amplifier module, according to an embodiment of the inventive concept.

FIG. 4 is cross-sectional views illustrating a method of packaging a power amplifier module, according to an embodiment of the inventive concept.

Referring to FIG. 4, in a power amplifier module packaging system according to an embodiment of the inventive concept, there may be provided a unified pattern 410 including a ceramic layer 411 and a pattern 412 formed on the ceramic layer 411.

Here, before a power amplifier module packaging process is performed, the pattern 412 may be formed on the ceramic layer 411, on which a groove 413 is formed, based on the use of the power amplifier module package in the power amplifier module packaging system. Here, the ceramic layer 411 may be formed of various insulating materials. For example, the pattern 412 may be formed according to a position (e.g., on the remaining area except an area where the groove 413 in which the chip 414 is integrated is located) of the groove 413 formed on the ceramic layer 411.

Next, the unified pattern 410 may be bonded on the metal layer 420. For example, in the power amplifier module packaging system, after a metal coating layer such as, but not limited thereto, Ni (e.g., various metal materials or metal mixture materials are used) is coated on a surface of the metal layer 420, the unified pattern 410 may be bonded on the surface on which the metal coating layer is coated.

Here, the metal layer 420 may be formed so as to include at least one connection frame 421 connecting a power amplifier module package to other modules. Here, the metal layer 420 may be formed of a mixture material of Cu and graphite, in the power amplifier module packaging system. However, the scope and spirit of the inventive concept may not be limited thereto. For example, in the power amplifier module packaging system, the metal layer 420 may be formed of various metal materials or metal mixture materials, which have thermal conductivity in a predetermined range and thermal expansion in a predetermined range.

Then, a ceramic sidewall 430 on which at least one external signal connection lead line 431 is formed may be deposited on the unified pattern 410 bonded on the metal layer 420, in the power amplifier module packaging system. Here, the at least one external signal connection lead line 431 may be bonded on a top surface of the ceramic sidewall 430. Here, the at least one external signal connection lead line 431 may be formed of various conductive materials.

Moreover, at least one vertical via plug 432 may be formed in the ceramic sidewall 430. For example, in the power amplifier module packaging system, the at least one vertical via plug 432 may be formed by filling a hole, formed in the ceramic sidewall 430, with a metal material such that the pattern 412 is connected to the at least one external signal connection lead line 431.

Moreover, a metal line 440 may be formed on the ceramic sidewall 430. The metal line 440 may be formed of various metal materials or metal mixture materials such that a cover 450 to be described is connected with the ceramic sidewall 430 in a laser welding manner (e.g., lid mounting). Moreover, an insulating layer 441 may be disposed between the metal line 440 and the at least one external signal connection lead line 431, which are on the ceramic sidewall 430. The insulating layer 441 may be formed of various insulation materials for forming the ceramic layer 411.

Next, a chip 414 may be integrated in the groove 413 of the ceramic layer 411 which is included in the unified pattern 410, in the power amplifier module packaging system. However, the scope and spirit of the inventive concept may not be limited thereto. For example, the chip 414 may be integrated in an external system equipped with the power amplifier module package. Moreover, the chip 414 may be integrated when the ceramic sidewall 430 is deposited on the unified pattern 410 bonded on the metal layer 420.

After that, the cover 450 may be mounted on the ceramic sidewall 430 which is deposited on the unified pattern 410 bonded on the metal layer 420, in the power amplifier module packaging system. Here, the cover 450 may be formed of various metal materials, metal mixture materials, or dielectric materials such as a material for forming the metal layer 420 in the power amplifier module packaging system.

As such, the power amplifier module packaging system according to an embodiment of the inventive concept may use the ceramic sidewall 430, thereby making it possible to manufacture the power amplifier module package with low manufacturing costs. Moreover, because the power amplifier module packaging system uses the unified pattern 410 including the ceramic layer 411 and the pattern 412 formed on the ceramic layer 411, an additional process for thinly or thickly forming and etching the ceramic layer 411 may not be carried out, thereby making it possible to manufacture the power amplifier module package using a simple manufacturing process.

Figure 5A:
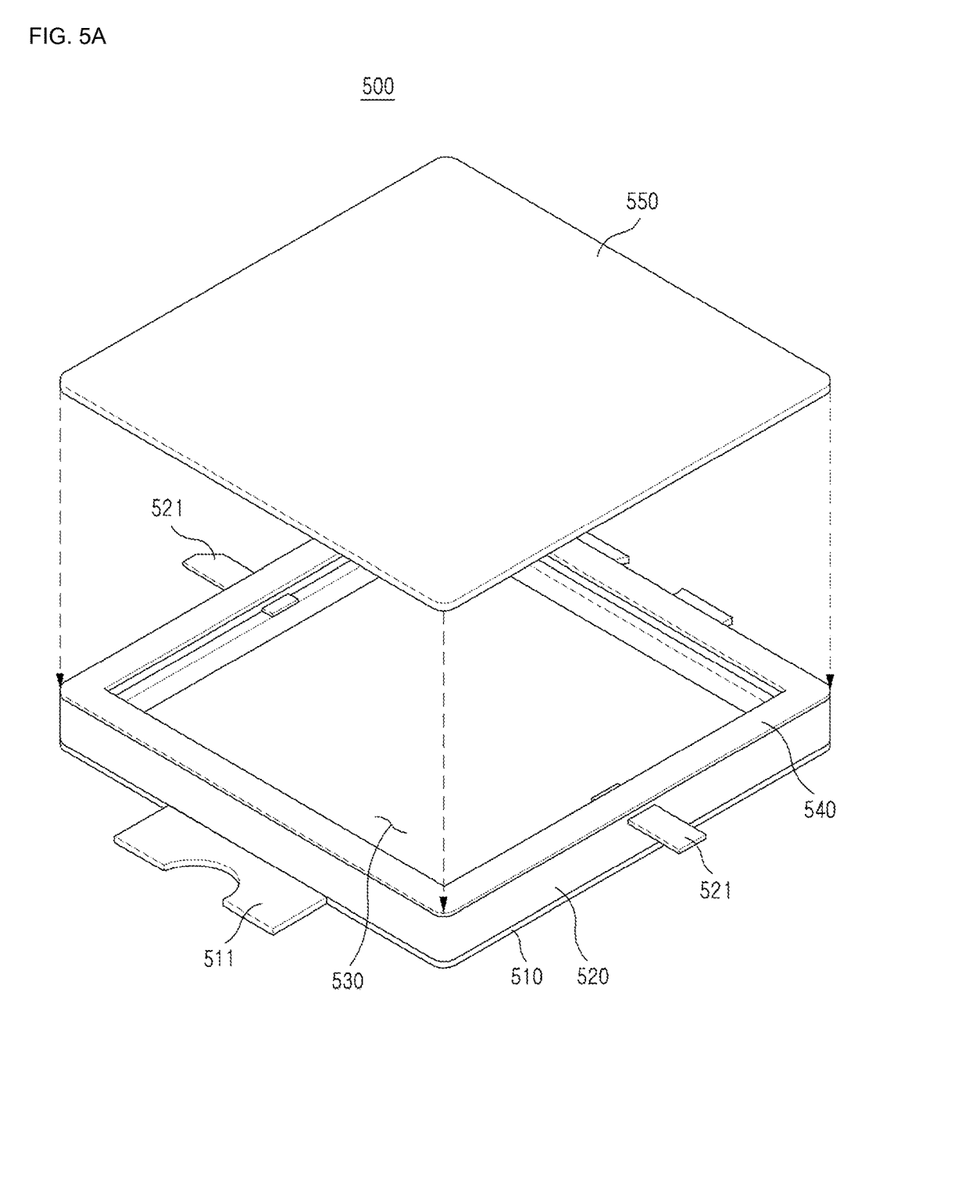
FIGS. 5A and 5B are diagrams illustrating a power amplifier module package according to another embodiment of the inventive concept.
Figure 5B:
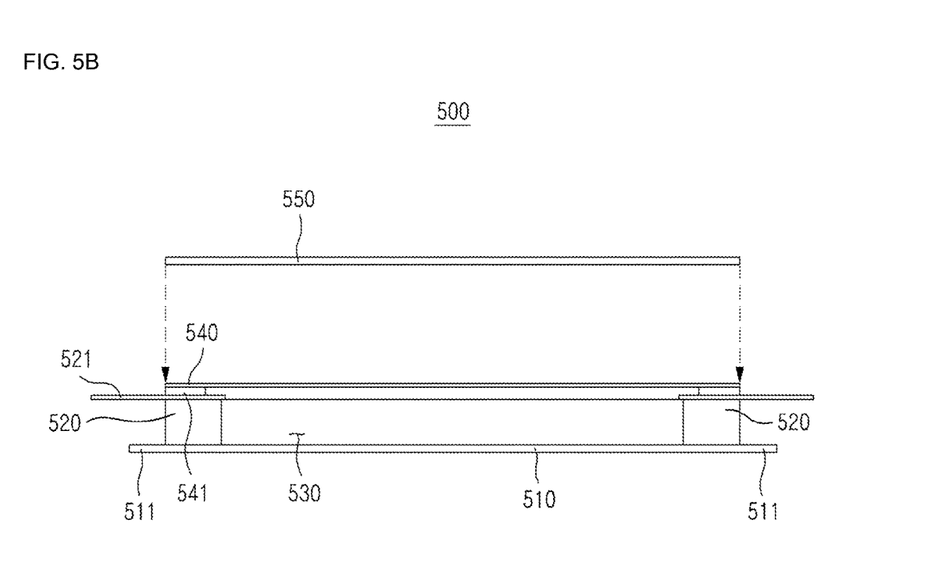

FIGS. 5A and 5B are diagrams illustrating a power amplifier module package according to another embodiment of the inventive concept. In detail, FIG. 5A is a perspective view illustrating a power amplifier module package according to another embodiment of the inventive concept, and FIG. 5B is a cross-sectional view illustrating a power amplifier module package according to another embodiment of the inventive concept.

Referring to FIGS. 5A and 5B, a power amplifier module package 500 may include a metal layer 510, a ceramic sidewall 520 deposited on the metal layer 510, and at least one external signal connection lead line 521 formed on a top surface of the ceramic sidewall 520. Below, unlike a power amplifier module package according to an embodiment of the inventive concept described with respect to FIGS. 1A and 1B, the power amplifier module package 500 according to another embodiment of the inventive concept may be a separation type package (i.e., a unified pattern will be inserted in an internal area 530 of the ceramic sidewall 520 by an external system equipped with the power amplifier module package 500) packaged without the unified pattern.

The metal layer 510 may include at least one connection frame 511 connecting the power amplifier module package 500 to other modules. Here, the metal layer 510 may be formed of a mixture material of Cu and graphite. However, the scope and spirit of the inventive concept may not be limited thereto. For example, the metal layer 510 may be formed of various metal materials or metal mixture materials which have thermal conductivity in a predetermined range and thermal expansion in a predetermined range.

Below, the ceramic sidewall 520 deposited on the metal layer 510 may be described as being formed of a ceramic material. However, the scope and spirit of the inventive concept may not be limited thereto. For example, the metal layer 510 may be formed of various materials including a conductive material, an insulating material, or the like. The at least one external signal connection lead line 521 may be formed on a top surface of the ceramic sidewall 520. For example, the at least one external signal connection lead line 521 may be bonded on a top surface of the ceramic sidewall 520. Here, the at least one external signal connection lead line 521 may be formed of various conductive materials.

Here, after a metal coating layer such as, but not limited thereto, Ni (e.g., various metal materials or metal mixture materials are used) is coated on a surface of the metal layer 510, the ceramic sidewall 520 may be deposited on the surface on which the metal coating layer is coated (i.e., the same as a process for bonding a metal layer on a unified pattern as illustrated in FIG. 3).

Moreover, a metal line 540 may be formed on the ceramic sidewall 520. Accordingly, a cover 550 may be mounted on the ceramic sidewall 520 deposited on the metal layer 510, with the metal line 540 interposed between the cover 550 and the ceramic sidewall 520. Here, the cover 550 may be formed of various metal materials or metal mixture materials such as a material for forming the metal layer 510 or may be formed of a dielectric material. Moreover, the metal line 540 may be formed of various metal materials or metal mixture materials to allow the cover 550 to be connected in a laser welding manner (e.g., lid mounting).

Here, the metal line 540 may be formed on a top surface of an insulating layer 541 for insulation between the metal line 540 and the at least one external signal connection lead line 521 formed on a top surface of the ceramic sidewall 520. The insulating layer 541 may be formed of various insulation materials for forming the ceramic sidewall 520.

Although not shown in FIGS. 5A and 5B, the at least one external signal connection lead line 521 formed on a top surface of the ceramic sidewall 520 may be connected to a pattern by wire bonding when a unified pattern is inserted in the divided package 500. That is, the wire bonding connecting the pattern to the at least one external signal connection lead line 521 may be carried out when a unified pattern is inserted by an external system equipped with the power amplifier module package 500.

Figure 6:
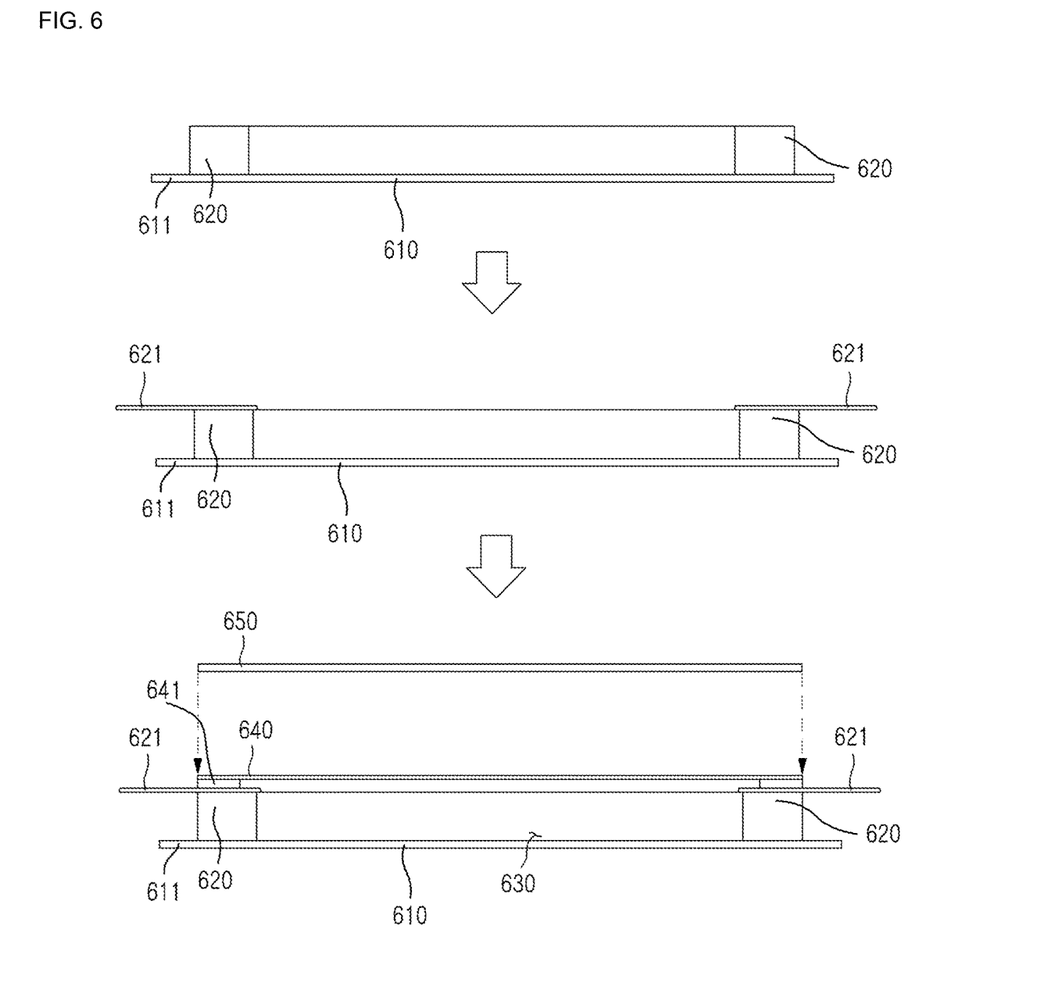
FIG. 6 is cross-sectional views illustrating a method of packaging a power amplifier module, according to another embodiment of the inventive concept.

FIG. 6 is cross-sectional views diagram illustrating a method of packaging a power amplifier module, according to another embodiment of the inventive concept.

Referring to FIG. 6, a ceramic sidewall 620 may be deposited on a metal layer 610, in a power amplifier module packaging system according to another embodiment of the inventive concept. Here, the metal layer 610 may be formed so as to include at least one connection frame 611 connecting a power amplifier module package to other modules. Here, the metal layer 610 may be formed of a mixture material of Cu and graphite, in the power amplifier module packaging system. However, the scope and spirit of the inventive concept may not be limited thereto. For example, the metal layer 610 may be formed of various metal materials or metal mixture materials, which have thermal conductivity in a predetermined range and thermal expansion in a predetermined range, in the power amplifier module packaging system.

Moreover, the ceramic sidewall 620 deposited on the metal layer 610 may be formed of various insulation materials, in the power amplifier module packaging system.

Next, at least one external signal connection lead line 621 may be formed on a top surface of the ceramic sidewall 620, in the power amplifier module packaging system. For example, in the power amplifier module packaging system, the at least one external signal connection lead line 621 may be bonded on a top surface of the ceramic sidewall 620. Here, the at least one external signal connection lead line 621 may be formed of various conductive materials.

Here, in the power amplifier module packaging system, after a metal coating layer such as, but not limited thereto, Ni (e.g., various metal materials or metal mixture materials are used) is coated on a surface of the metal layer 610, the ceramic sidewall 620 may be bonded on the surface on which the metal coating layer is coated.

Next, a metal line 640 may be formed on the ceramic sidewall 620, in the power amplifier module packaging system. The metal line 640 may be formed of various metal materials or metal mixture materials to allow a cover 650 to be connected on the ceramic sidewall 620 in a laser welding manner (e.g., lid mounting).

Moreover, in the power amplifier module packaging system, an insulating layer 641 may be disposed between the metal line 640 and at least one external signal connection lead line 621, which are on the ceramic sidewall 620. The insulating layer 641 may be formed of various insulation materials for forming the ceramic layer 611.

Although not shown in FIG. 6, in the power amplifier module packaging system, a unified pattern may be inserted in an internal area 630 of the ceramic sidewall 620 by an external system equipped with a divided package formed by an aforementioned process. Here, in the power amplifier module packaging system, wire bonding may be performed such that the at least one external signal connection lead line 621 is connected to a pattern when a unified pattern is inserted by an external system equipped with the divided package.

As such, the power amplifier module packaging system according to an embodiment of the inventive concept may use the ceramic sidewall 620, thereby making it possible to manufacture the power amplifier module package with low manufacturing costs. Moreover, an additional process for thinly or thickly forming and etching a ceramic layer may not be performed in the power amplifier module packaging system, thereby making possible to manufacture the power amplifier module package using the simple manufacturing process.

Embodiments of the inventive concept may provide a method of packaging a power amplifier module using a unified pattern including a ceramic layer and a pattern formed on the ceramic layer and a power amplifier module package manufactured according to the method.

Other embodiments of the inventive concept may provide a method of packaging a power amplifier module using a ceramic sidewall, and a power amplifier module package manufactured according to the method, thereby lowering manufacturing costs.

Other embodiments of the inventive concept may provide a method of packaging a power amplifier module, which uses a unified pattern including a ceramic layer and a pattern formed on the ceramic layer, and a power amplifier module package manufactured according to the method. Thus, it may be possible to manufacture the power amplifier module package without an additional process for thinly or thickly forming and etching a ceramic layer.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of packaging a power amplifier module, comprising:
    providing a unified pattern comprising a ceramic layer and a pattern formed on and above the ceramic layer;
    bonding the unified pattern on a metal layer;
    depositing a ceramic sidewall, on which at least one external signal connection lead line is formed, directly on and above and in physical contact with the ceramic layer included in the unified pattern bonded on the metal layer, wherein a hole is formed in the ceramic sidewall;
    forming a metal line above the ceramic sidewall;
    disposing an insulating layer between the ceramic sidewall and the metal line and between the at least one external signal connection lead line and the metal line;
    forming at least one vertical via plug within the hole to thereby connect the at least one external signal connection lead line to the pattern, wherein the at least one external signal connection lead line is configured to connect to an external device; and
    mounting a cover on the metal line formed on the ceramic sidewall deposited on the ceramic layer included in the unified pattern bonded on the metal layer;
    wherein the metal layer includes at least one connection frame connecting the power amplifier module to an other module.

2. The method of claim 1, wherein the bonding of the unified pattern comprises:
    coating a metal coating layer on a surface of the metal layer; and
    bonding the unified pattern on the surface on which the metal coating layer is coated.

3. The method of claim 1, further comprising:
    integrating a chip in a groove, which is formed on the ceramic layer included in the unified pattern, so as to be connected with the pattern.

4. The method of claim 1, wherein the step of depositing comprises forming the at least one external signal connection lead line on a top surface of the ceramic sidewall.

* * * * *